United States Patent
Hsu et al.

(10) Patent No.: US 7,106,145 B2
(45) Date of Patent: Sep. 12, 2006

(54) SIGNAL TRANSMISSION STRUCTURE HAVING SALIENTS ALIGNED WITH NON-REFERENCE REGIONS

(75) Inventors: Jimmy Hsu, Taipei Hsien (TW); Teddy Chou, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 135 days.

(21) Appl. No.: 10/889,879

(22) Filed: Jul. 12, 2004

(65) Prior Publication Data

US 2005/0083152 A1 Apr. 21, 2005

(30) Foreign Application Priority Data

Oct. 17, 2003 (TW) .............................. 92128842 A

(51) Int. Cl.
*H01P 3/08* (2006.01)
(52) U.S. Cl. ......................................... 333/34; 333/246
(58) Field of Classification Search ..................... 333/4, 333/5, 34, 238, 246
See application file for complete search history.

(56) References Cited

U.S. PATENT DOCUMENTS

| 3,573,670 | A | | 4/1971 | Skobern et al. ................. 333/33 |
| 3,876,964 | A | * | 4/1975 | Balaster et al. ............. 333/238 |
| 5,093,639 | A | | 3/1992 | Franchi et al. ................. 333/24 |
| 6,577,211 | B1 | * | 6/2003 | Tsujiguchi ................... 333/204 |
| 6,590,466 | B1 | * | 7/2003 | Lin et al. ......................... 333/1 |
| 6,624,729 | B1 | * | 9/2003 | Wright et al. ............... 333/238 |

* cited by examiner

*Primary Examiner*—Benny Lee
(74) *Attorney, Agent, or Firm*—J.C. Patents

(57) ABSTRACT

A signal transmission structure is provided. The signal transmission structure has salients. The salients are corresponding to the position of the non-reference region and protrude from a lateral side of the signal traces. When the signals are transmitted on the signal traces, the parasitic capacitance between the salients and the reference plane can improve the characteristic impedance mismatch. Hence, when the signals are transmitted in a high frequency/high speed environment, the salients of the signal transmission structure reduce the effect of the near-end and far-end crosstalk generated by the other signal trace when a signal trace passes through a non-reference region, in order to keep the good quality of the signals.

20 Claims, 4 Drawing Sheets

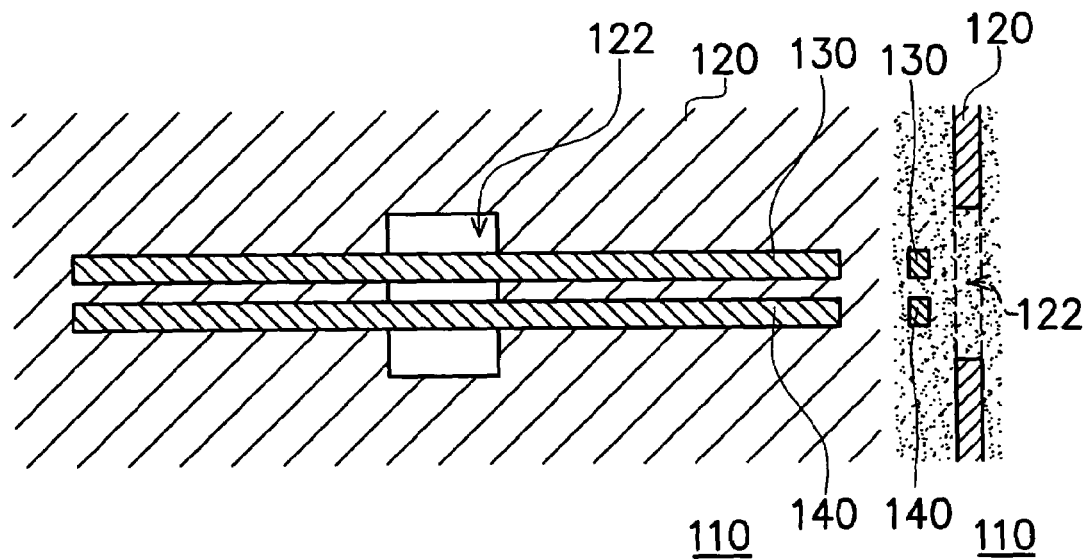
FIG. 1A (PRIOR ART)
FIG. 1B (PRIOR ART)
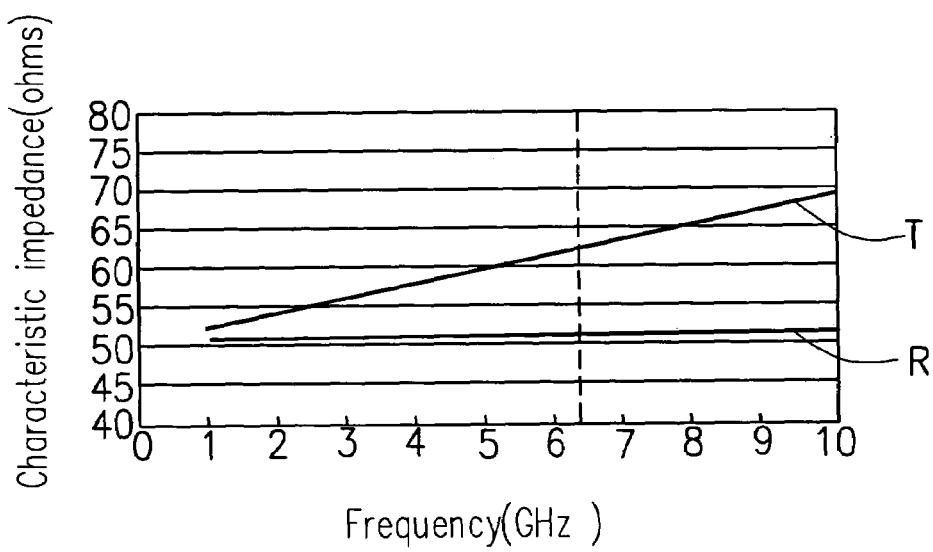
FIG. 2 (PRIOR ART)

SIGNAL TRANSMISSION STRUCTURE HAVING SALIENTS ALIGNED WITH NON-REFERENCE REGIONS

CROSS-REFERENCE TO RELATED APPLICATION

This application claims the priority benefit of Taiwan application Ser. No. 92128842, filed on Oct. 17, 2003, the full disclosure of which is incorporated herein by reference.

BACKGROUND OF THE INVENTION

1. Field of the Invention

This invention generally relates to a signal transmission structure, and more particularly to a signal transmission structure for improving the mismatch of the characteristic impedance of the signal transmission structure when the signal trace passes through a non-reference region.

2. Description of Related Art

On a printed circuit board and packaging substrate, the signal trace used for connecting two devices or two terminals has to maintain a uniform trace width in order to keep a constant characteristic impedance when the electronic signals are transmitted on the signal trace. Especially when the signals are transmitted in a high speed and a high frequency environment, a good impedance matching design between the two terminals are required to reduce the reflection due to the impedance mismatch, i.e., to reduce the insertion loss and increase the return loss when transmitting the signals so that the quality of the signal transmission will not be affected.

FIGS. 1A and 1B show a top view and a side view of a conventional signal trace through a non-reference region. The signal transmission structure 110 at least includes a reference plane 120 and two signal traces 130 and 140. The reference plane 120 for example is a power plane or a ground plane. The signal traces 130 and 140 have a uniform trace width. It should be noted that in the conventional circuit design, the reference plane will have a plurality of through holes due to the hole drilling or cutting between the planes, or will have a non-reference region 122 (such as a non-reference region opening). Hence, when the signals are transmitted on the signal traces 130 and 140, a high impedance will occurs at the non-reference region 122. Further, the coupling inductance between the signal traces 130 and 140 also increases so that the effect of the near-end crosstalk and the far-end crosstalk becomes more serious. Therefore, the signals cannot be completely transmitted from the one terminal of the signal traces 130 and 140 to the other terminal.

FIG. 2 shows the relationship between the characteristic impedance and the frequency when the conventional signal trace passes through a reference plane (solid line R) and a non-reference region (solid line T), respectively. Referring to FIGS. 1A and 2, when the working frequency is higher, the characteristic impedance is higher when the conventional signal traces 130 and 140 at the same frequency pass through a non-reference region 122. Hence, the impedance mismatch occurs. Therefore, when the signal traces pass through an incomplete reference plane 120, the characteristic impedance of the signal traces 130 and 140 increase as the frequency increases. Hence, the difference between the original characteristic impedance and the affected characteristic impedance also increases, which causes a more serious characteristic impedance mismatch on the signal traces 130 and 140.

SUMMARY OF THE INVENTION

An object of the present invention is to provide a signal transmission structure for improving the characteristic impedance mismatch when the signal trace passes through a non-reference region.

Another object of the present invention is to provide a signal transmission structure to improve the effect of the near-end and far-end crosstalk generated by the other signal trace when a signal trace passes through a non-reference region, in order to keep the good quality of the signals.

The present invention provides a signal transmission structure for a circuit board, comprising: a reference plane having a non-reference region; and a first signal trace on a side of the reference plane, the first signal trace having at least one first salient corresponding to the position of the non-reference region and protruding from a lateral side of the first signal trace; and a second signal trace on the side of the reference plane, the signal trace having at least one second salient corresponding to the position of the non-reference region and protruding from a lateral side of the second signal trace, wherein the first salient and the second salient are not between the first signal trace and the second signal trace.

The present invention provides a signal transmission structure for a circuit board, comprising: a reference plane having a non-reference opening; a first signal trace on a side of the reference plane, the first signal trace having at least one salient corresponding to the position of the non-reference region and protruding from a lateral side of the first signal trace; and a second signal trace on the side of the reference plane, wherein the salient is not between the first and the second signal traces.

In the first preferred embodiment of the present invention, the reference plane is one of a power plane and a ground plane; the first and second signal traces are co-planar, the reference plane and the first and second signal traces are not co-planar, and both first and second signal traces pass through the non-reference region. Further, a portion of the first salient partially extends to above an area out of the non-reference region, and a portion of the second salient partially extends to above an area out of the non-reference region. In additional, in the second preferred embodiment of the present invention, the first and second signal traces are co-planar, the reference plane and the first and second signal traces are not co-planar, and the second signal trace does not pass through the non-reference region.

The present invention uses a signal transmission structure with at least one salient. The salient is corresponding to the position of the non-reference region and protrude from a lateral side of the signal trace. When the signals are transmitted on the signal traces, the parasitic capacitance between the salients and the reference plane can improve the characteristic impedance mismatch. Hence, when the signals are transmitted in a high frequency/high speed environment, the salients of the signal transmission structure reduce the effect of the near-end and far-end crosstalk generated by the other signal trace when a signal trace passes through a non-reference region, in order to keep the good quality of the signals.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

FIGS. 1A and 1B show a top view and a side view of a conventional signal trace through a non-reference region.

FIG. 2 shows the relationship between the characteristic impedance and the frequency when the conventional signal trace passes through a reference plane and a non-reference region, respectively.

DESCRIPTION OF THE PREFERRED EMBODIMENTS

Figures 3A, 3B:
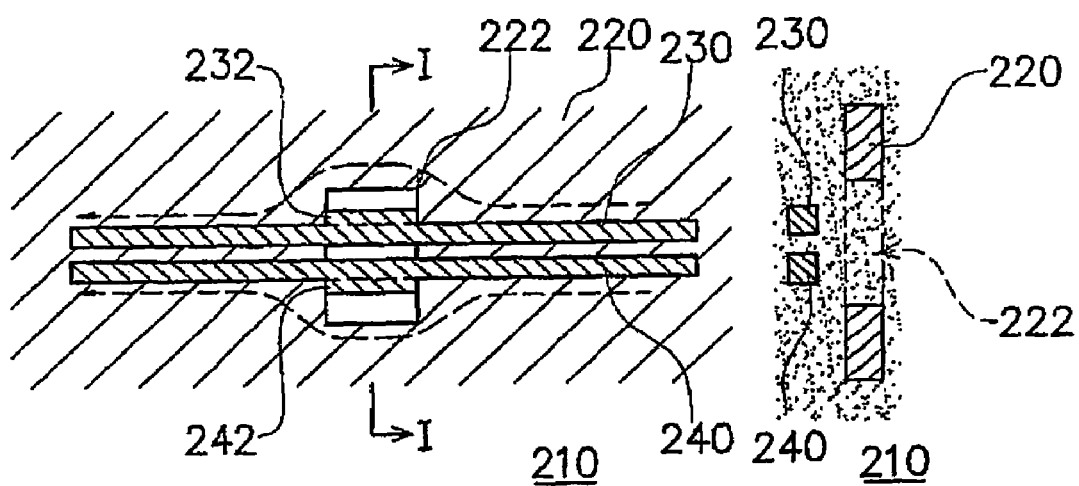
FIGS. 3A and 3B show a top view and a cross-sectional view (along the I—I line) of a signal transmission structure for a circuit board in accordance with the first preferred embodiment of the present invention.

FIGS. 3A and 3B show a top view and a cross-sectional view (along the I—I line) of a signal transmission structure for a circuit board in accordance with a preferred embodiment of the present invention. The signal transmission structure 210 is for a circuit board such as a printed circuit board or a packaging structure. The signal transmission structure 210 at least includes a reference plane 220 and two signal traces 230 and 240. The signal traces 230 and 240 are on the same side of the reference plane 220, and the signal traces 230 and 240 are co-planar. The signal traces 230 and 240 and the reference plane 220 are not co-planar. Further, the reference plane 220 can be a power plane or a ground plane, and a portion of reference plane 220 forms a non-reference region 222 such as a non-reference opening due to hole drilling or cutting. The signal traces 230 and 240 have a salient 232 and 242 respectively as shown in FIG. 3A. The salients 232 and 242 are not between the signal traces 230 and 240. Hence, when the signals are transmitted on the signal traces 230 and 240, the widened salients 232 and 242 prevents the high impedance at the non-reference region 222. Therefore, when the signals pass through the salients 232 and 242, the increased parasitic capacitance between the salients 232 and 242 and the reference plane 220 can improve the impedance mismatch.

Referring to FIGS. 3A and 3B, when the signals are transmitted in a high frequency/high speed environment, the salients 232 and 242 of the signal transmission structure reduces the effect of the near-end and far-end crosstalk generated by the other signal trace, and reduces the coupling inductance between the signal traces 230 and 240 for good quality of the signals so that the signals can be completely transmitted from the one terminal of the signal traces 230 and 240 to the other terminal.

To calculate the impedance of the signal traces 232 and 234, the characteristic impedance Z is approximately equal to $$Z = \sqrt{\frac{L}{C}},$$

wherein L is the equivalent inductance of the signal trace, and C is the equivalent capacitance of the signal trace. To the conventional design, the equivalent inductance L of the signal trace will be increased when the signals pass through the non-reference region, thereby increasing the characteristic impedance Z. However, this embodiment increases the equivalent capacitance C of the signal traces 230 and 240 so that the characteristic impedance Z at the non-reference region 222 can be reduced because of the increase of the parasitic capacitance at the non-reference region 222. Hence the characteristic impedance Z of the signal traces 230 and 240 becomes uniform in order to reach characteristic impedance match.

The salients 232 and 242 are designed to be wider so that the area the signal traces 230 and 240 and the reference plane 220 can be increased. Hence, the equivalent capacitance C between the signal traces 230 and 240 and the reference plane 220 is also increased. Hence, when the signals pass through the widened salients 232 and 234, the parasitic capacitance increased due to the salients 232 and 234 can effectively improve the effect of the impedance mismatch of the signal traces 230 and 240.

Figure 4:
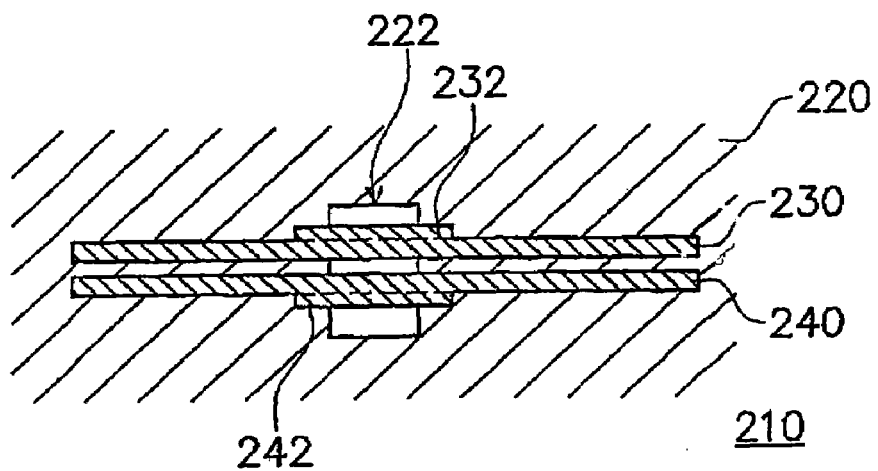
FIGS. 4 and 5 show top views of a signal transmission structure for a circuit board in accordance with the other preferred embodiments of the present invention.
Figure 5:
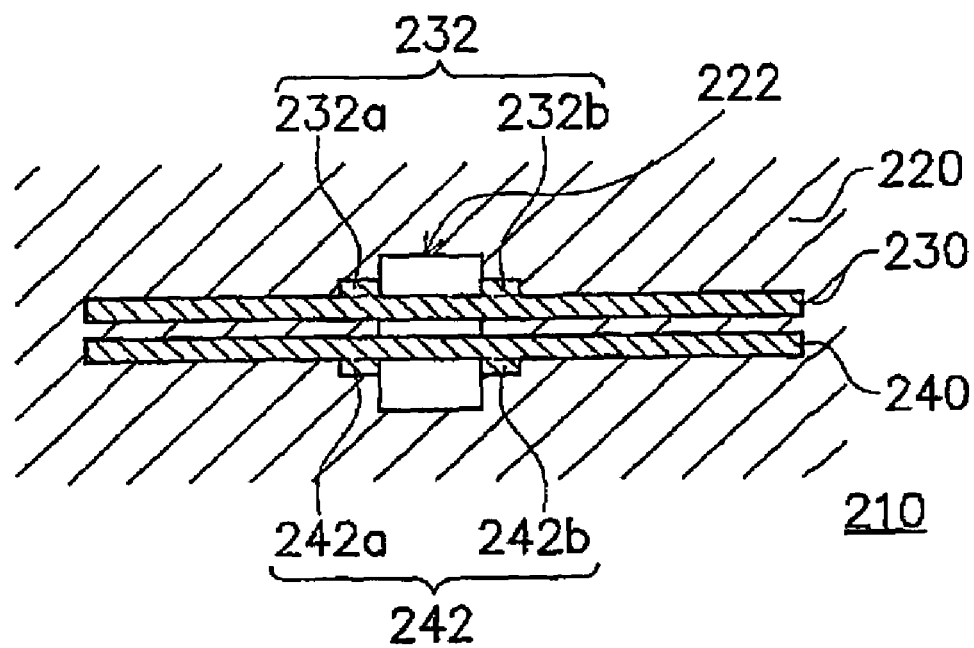

FIGS. 4 and 5 show top views of a signal transmission structure 210 for a circuit board in accordance with the other preferred embodiments of the present invention. As shown in FIG. 4, the salients 232 and 242 can extend to an area above the non-reference region 222. Therefore, by increasing the equivalent capacitance C of the salients 232 and 242, the characteristic impedance Z of the signal traces 230 and 240 becomes uniform in order to reach characteristic impedance match of the signal traces 230 and 240. In addition, as shown in FIG. 5, the signal traces 230 and 240 have salients 232 and 242 respectively. The salient 232 includes a left salient portion 232a and a right salient portion 232b. The salient 242 includes a left salient portion 242a and a right salient portion 242b. The left salient portions 232a and 242a are on one side of the non-reference region corresponding to an extension direction of the signal traces 230 and 240. The right salient portions 232b and 242b are on an opposite side of the non-reference region 222 corresponding to an extension direction of the signal traces 230 and 240. Therefore, by increasing the equivalent capacitance C of the salients 232 and 242, the characteristic impedance Z of the signal traces 230 and 240 becomes uniform in order to reach characteristic impedance match of the signal traces 230 and 240.

Figure 6:
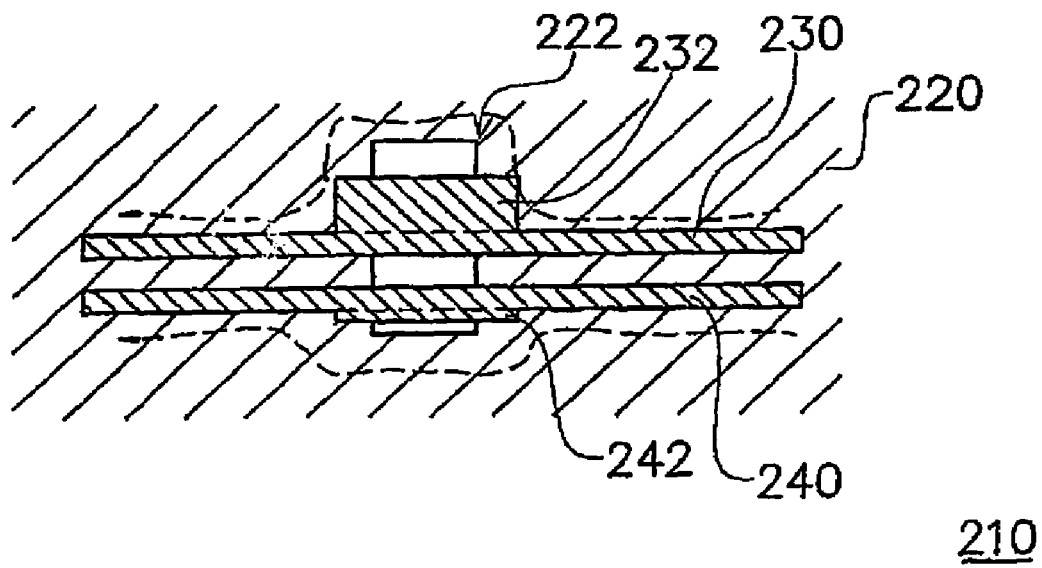
FIG. 6 shows a top view of a signal transmission structure for a circuit board in accordance with another preferred embodiment of the present invention.

FIG. 6 shows a top view of a signal transmission structure 210 for a circuit board in accordance with another preferred embodiment of the present invention. Referring to FIG. 6, the signal traces 230 and 240 have salients 232 and 242 respectively. The salients 232 and 242 change their areas based on the location where the signal traces 230 and 240 pass through the non-reference region 222. For example, as shown in FIG. 6, the signal trace 230 passes above the central portion of the non-reference region 222, and the signal trace 240 passes above the edge portion of the non-reference region 222. Because the variance of the high impedance is different, the areas of the salients 232 and 242 are also different in order to compensate the impedance mismatch due to the different paths where the signal traces 230 and 240 pass through the non-reference region 222.

Figures 7A, 7B:
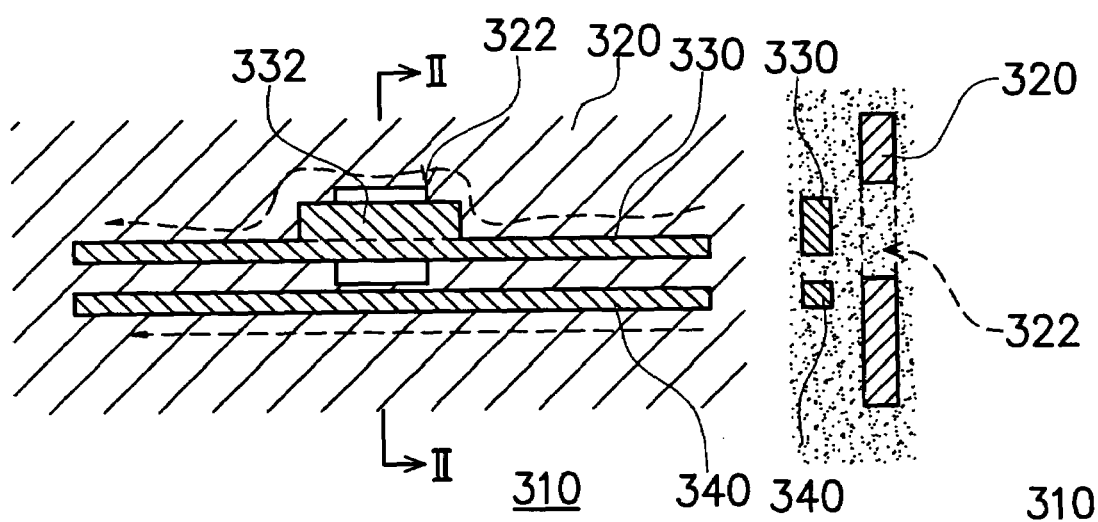
FIGS. 7A and 7B show a top view and a cross-sectional view (along the II—II line) of a signal transmission structure for a circuit board in accordance with the second preferred embodiment of the present invention.

FIGS. 7A and 7B show a top view and a cross-sectional view (along the II—II line) of a signal transmission structure for a circuit board in accordance with the second preferred embodiment of the present invention. The signal transmission structure 310 is for a circuit board such as a printed circuit board or a packaging structure. The signal transmission structure 310 at least includes a reference plane 320 and two signal traces 330 and 340. The signal traces 330 and 340 are on the same side of the reference plane 320 and the signal traces 330 and 340 are co-planar. The signal traces 330 and 340 and the reference plane 320 are not co-planar. Further, the reference plane 320 can be a power plane or a ground plane, and a portion of reference plane 320 forms a non-reference region 322 such as a non-reference opening due to hole drilling or cutting. The signal trace 330 has a salient 332 as shown in FIG. 7A. The salient 332 is corresponding to the lateral side of the signal trace 330. The signal trace 340 is on a side of the signal trace 330 away from the salient 332. The signal trace does not pass through above the non-reference region 322. Hence, when the signals are transmitted on the signal trace 330, the salient 332 prevents the high impedance at the non-reference region 322. Therefore, when the signals pass through the salient 332, the increased parasitic capacitance between the salient 332 and the reference plane 320 can improve the impedance mismatch of the signal trace 330.

Referring to FIGS. 7A and 7B, When the signals are transmitted on the signal traces 330 and 340, the parasitic capacitance between the salient 332 and the reference plane 320 can improve the characteristic impedance mismatch. Hence, when the signals are transmitted in a high frequency/high speed environment, the salient 332 of the signal trace 330 reduces the effect of the near-end and far-end crosstalk generated by the other signal trace 340, and reduces the coupling inductance between the signal traces 330 and 340, in order to keep good quality of the signals so that the signals can be completely transmitted from the one terminal of the signal traces 330 and 340 to the other terminal.

In brief, the signal transmission structure of the present invention at least includes two signal traces and a reference plane. The reference plane has a non-reference region. The two signal traces are on a side of the reference plane and each has a salient. The width of the salients is wider than the width of the signal traces. The salient are corresponding to the position of the non-reference region. The salients are respectively corresponding to the lateral sides of the two signal traces, and not between the signal traces 230 and 240. The area of the salients is proportional to the area of the non-reference region, and the area of the salients can be equal to the area of the non-reference region. When the signals are transmitted on the signal traces, the parasitic capacitance between the salients and the reference plane can improve the characteristic impedance mismatch. Hence, when the signals are transmitted in a high frequency/high speed environment, the signal transmission structure can reduce the effect of the characteristic impedance mismatch when the signals pass the non-reference region so that the characteristic impedance can match in the two signal traces.

In light of the above, the signal transmission structure of the present invention has the following advantages:

1. The present invention can overcome the high impedance generated when the signals pass through the non-reference region by increasing the equivalent capacitance of the salient. Therefore, the characteristic impedance of the signal traces becomes uniform to reach the impedance match.

2. The present invention can reduce the coupling inductance on the other signal trace when the signals are pass through the non-reference region by using the salients in the signal traces.

3. The present invention can regulate the current path by using the salients in the signal trace to reduce the effect of the near-end and far-end crosstalk generated by the other signal trace in order to keep good quality of the signals.

4. The signal transmission structure of the present invention can be widely applied in a printed circuit board or a packaging substrate.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A signal transmission structure for a circuit board, comprising:
    a reference plane having a non-reference region; and
    a first signal trace on a side of said reference plane, said first signal trace having a first salient corresponding to the position of said non-reference region and protruding from a lateral side of said first signal trace; and
    a second signal trace on said side of said reference plane, said signal trace having a second salient corresponding to the position of said non-reference region and protruding from a lateral side of said second signal trace, wherein said first salient and said second salient are not between said first signal trace and said second signal trace.

2. The signal transmission structure of claim 1, wherein said reference plane is a power plane.

3. The signal transmission structure of claim 1, wherein said reference plane is a ground plane.

4. The signal transmission structure of claim 1, wherein said first and second signal traces are co-planar, and said reference plane and said first and second signal traces are not co-planar.

5. The signal transmission structure of claim 4, wherein a portion of said first salient partially extends to above an area out of said non-reference region.

6. The signal transmission structure of claim 4, wherein a portion of said second salient partially extends to above an area out of said non-reference region.

7. The signal transmission structure of claim 1, wherein said non-reference region has a large portion and a small portion, said first signal trace passes said large portion, and said second signal trace passes said small portion; wherein said first salient is proportional to said large portion and said second salient is proportional to said small portion.

8. A signal transmission structure for a circuit board, comprising:
    a reference plane having a non-reference region;
    a first signal trace on a side of said reference plane, said first signal trace having a salient corresponding to the position of said non-reference region and protruding from a lateral side, of said first signal trace; and
    a second signal trace on said side of said reference plane, said second signal trace being at a side of said first signal trace away from said salient.

9. The signal transmission structure of claim 8, wherein a portion of said salient partially extends to above an area out of said non-reference region.

10. The signal transmission structure of claim 8, wherein said reference plane is a power plane.

11. The signal transmission structure of claim 8, wherein said reference plane is a ground plane.

12. The signal transmission structure of claim 8, wherein said first and second signal traces are co-planar, said reference plane and said first and second signal traces are not co-planar, and said second signal trace does not pass through said non-reference region.

13. The signal transmission structure of claim 12, wherein the area of said salient is proportional to the area of said non-reference region.

14. A signal transmission structure for a circuit board, comprising:
   a reference plane having a non-reference region;
   a first signal trace passing through said non-reference region and having a first salient, wherein said first salient includes a left salient portion and a right salient portion, said left salient portion being on one side of said non-reference region corresponding to an extension direction of said first signal trace, said right salient portion being on an opposite side of said non-reference region corresponding to an extension direction of said first signal trace; and
   a second signal trace passing through said reference plane.

15. The signal transmission structure of claim 14, wherein the area of said first salient is proportional to the area of said non-reference region.

16. The signal transmission structure of claim 14, wherein said reference plane is a ground plane.

17. The signal transmission structure of claim 14, wherein said reference plane is a power plane.

18. The signal transmission structure of claim 14, wherein said second signal trace passing through said non-reference region and having a second salient, wherein said second salient includes a left salient portion and a right salient portion, said left salient portion being on one side of said non-reference region corresponding to an extension direction of said second signal trace, said right salient portion being on an opposite side of said non-reference region corresponding to an extension direction of said second signal trace.

19. The signal transmission structure of claim 18, wherein said first salient is not between said first signal trace and said second signal trace.

20. The signal transmission structure of claim 19, wherein said second salient is not between said first signal trace and said second signal trace.

* * * * *